(12) United States Patent
Ozawa

(10) Patent No.: US 7,096,386 B2
(45) Date of Patent: Aug. 22, 2006

(54) SEMICONDUCTOR INTEGRATED CIRCUIT HAVING FUNCTIONAL MODULES EACH INCLUDING A BUILT-IN SELF TESTING CIRCUIT

(75) Inventor: Kazumasa Ozawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 613 days.

(21) Appl. No.: 10/246,636

(22) Filed: Sep. 19, 2002

(65) Prior Publication Data

US 2004/0059959 A1   Mar. 25, 2004

(51) Int. Cl.
*G06F 11/00* (2006.01)
(52) U.S. Cl. .................. 714/30; 714/36; 714/724; 714/733
(58) Field of Classification Search ............ 714/30, 714/36, 724, 733
See application file for complete search history.

(56) References Cited

U.S. PATENT DOCUMENTS

| | | |
|---|---|---|
| 5,861,774 A | 1/1999 | Blumenthal |
| 6,255,836 B1 | 7/2001 | Schwarz et al. |
| 6,311,300 B1 | 10/2001 | Omura et al. |
| 6,436,741 B1 * | 8/2002 | Sato et al. .................. 438/149 |
| 6,871,297 B1 * | 3/2005 | Puri et al. .................. 714/30 |
| 2002/0147949 A1 * | 10/2002 | Lamb et al. ............... 714/718 |

OTHER PUBLICATIONS

Sudhakar M. Reddy and et al., "A Data Compression Technique for Built-In Self-Test" published by IEEE Transactions on Computers, vol. 37, No. 9, Sep. 1988, pp. 1151-1156.*

* cited by examiner

*Primary Examiner*—Scott Baderman
*Assistant Examiner*—Timothy M. Bonura
(74) *Attorney, Agent, or Firm*—Volentine Franocs & Whitt PLLC

(57) ABSTRACT

A semiconductor integrated circuit that allows a self test of an integrated circuit built into a system to be conducted through a circuit structure on a smaller scale and achieves an improvement in the accuracy of the self test is provided. An integrated circuit includes functional modules respectively provided with built-in self testing circuits and a self test control circuit that individually controls the built-in self testing circuits. This structure allows self tests to be automatically performed within the integrated circuit without requiring external components. The scale of the system having the built-in integrated circuit may thus be reduced. Also, by building up the built-in self testing circuits in the individual functional modules to a sufficient degree, a high-quality self test comparable to that conducted prior to shipment can be performed even after the integrated circuit is built into the system.

11 Claims, 4 Drawing Sheets

SEMICONDUCTOR INTEGRATED CIRCUIT HAVING FUNCTIONAL MODULES EACH INCLUDING A BUILT-IN SELF TESTING CIRCUIT

BACKGROUND OF THE INVENTION

1. Field of the Invention

The present invention relates to a semiconductor integrated circuit, and more specifically, it relates to a semiconductor integrated circuit having a built-in self test: (BIST) system.

2. Description of the Related Art

Some LSIs, such as system LSIs (large-scale integrated circuits) mounted in vehicles, are utilized under difficult conditions such as high temperature or vibration. When an LSI is used under such conditions, the LSI must be tested in some way even after the LSI is installed in the product in order to ensure that the LSI is not engaged in operation after a failure occurs therein. Under normal circumstances, the LSI conducts a self test every time power to the product is turned on.

A test ROM (read only memory) having a test program written therein is normally mounted outside the LSI to enable the LSI to conduct the self test. The operation of the LSI is tested in conformance to the test program written in the test ROM when the power to the product is turned on. This type of self test is typically conducted in a product mounted with an LSI so that the product only enters the normal operating mode after it is verified that the LSI is functioning correctly.

However, the following problems arise in the self testing method described above. Firstly, the scale of the system configuration, which includes a power-on detection circuit provided outside the LSI, is bound to be large. In such a case, the presence of the test ROM itself poses an obstacle to reducing the scale of the system LSI. Secondly, since the internal operation at the LSI is executed via a CPU (central processing unit), only part of the LSI can be tested, making the accuracy of the self test less than completely reliable.

SUMMARY OF THE INVENTION

The main object of the present invention, which has been completed by addressing the problems of semiconductor integrated circuits in the related art discussed above, is to provide a new and improved semiconductor integrated circuit that allows a self test in the semiconductor integrated circuit which is built in a system to be conducted through a circuit structure on a smaller scale and achieves an improvement in the accuracy of the self test.

In order to achieve the object described above, in a first aspect of the present invention, a semiconductor integrated circuit comprising one or a plurality of functional modules (104, 105 and 106) each having a built-in self testing circuit and a self test control circuit (102) that individually controls the built-in self testing circuits is provided.

This structure, which includes built-in self testing circuits provided for the individual functional modules and thus does not require any external components, enables an automatic self test to be conducted inside the semiconductor integrated circuit. The structure allows the scale of the system, which includes the semiconductor integrated circuit, to be reduced. In addition, by building up the built-in self testing circuits at the individual functional modules to a sufficient degree, a self test can be conducted that is comparable to the quality of factory tests conducted prior to shipment, even after the semiconductor integrated circuit is mounted in the system.

Furthermore, the semiconductor integrated circuit may include a power-on detection circuit (103) that detects that the power has been turned on. Since this allows the semiconductor integrated circuit to detect that the power to the semiconductor integrated circuit has been turned on for itself, the semiconductor integrated circuit can automatically shift into a self test mode. In addition, since the power-on detection circuit is built into the semiconductor integrated circuit instead of providing it as an external component, the scale of the system having the built-in semiconductor integrated circuit can be reduced.

The functional modules mounted at the semiconductor integrated circuit are each a memory such as a RAM, an analog circuit such as an analog/digital conversion circuit or a digital/analog conversion circuit or a logic circuit constituted of various logic elements, for instance.

By providing a switch (110*a*) for disconnecting the functional modules from an input/output terminal (110) during a self test of the functional modules, the individual functional modules can be prevented from becoming affected by any external factors originating from the outside of the semiconductor integrated circuit during the self test.

By providing at each functional module a self test result output terminal (208) through which the results of the self test are to be output, the length of time required to analyze any problems is reduced to achieve quick feedback.

In addition, by providing a counter (207) capable of measuring the length of time elapsing through a self test and outputting a time count together with the results of the self test, information is provided indicating specifically at what point in time during the self test cycle a given problem is discovered in each self test to make it possible to identify a problem even more accurately.

By providing nonvolatile memories (417-1, 417-2) within the logic circuit and storing self test patterns in the nonvolatile memories, automatic test pattern generation (ATPG) can be realized in the hardware to enable a self test achieving a high failure detection rate.

By storing self test patterns having undergone compression processing in the nonvolatile memories and providing data decompression circuits (419-1, 419-2) that decompress the compressed self test patterns within the logic circuit, automatic test pattern generation (ATPG) can be realized with fewer self test patterns to allow the physical size of the nonvolatile memories to be reduced.

By providing pattern defect detection circuits (420-1, 420-2) for detecting any defects in the self test patterns within the logic circuit, the defects in the self test patterns can be eliminated to achieve an even more reliable self test.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
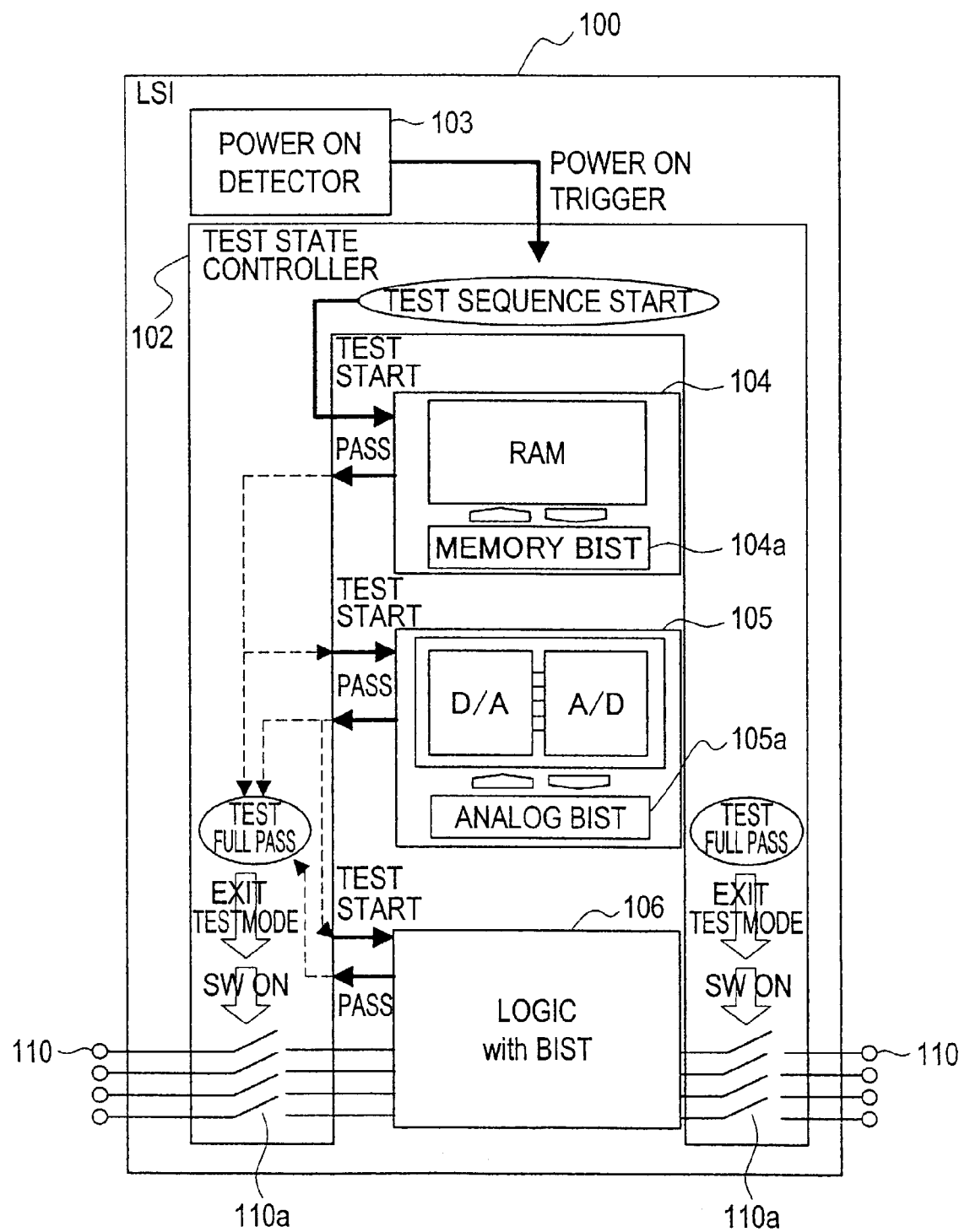
FIG. 1 illustrates the circuit structure adopted in a first embodiment.

The following is a detailed explanation of the preferred embodiments of the semiconductor integrated circuit according to the present invention, given in reference to the attached drawings. It is to be noted that the same reference numerals are assigned to components assuming substantially identical functions and structural features in the specification and the drawings to preclude the necessity for a repeated explanation thereof.

FIRST EMBODIMENT

The semiconductor integrated circuit in the first embodiment is now explained in reference to FIG. 1.

A semiconductor integrated circuit 100 comprises a power-on detection circuit 103 that detects that the power to the semiconductor integrated circuit 100 has been turned on and a self test control circuit 102 that shifts the semiconductor integrated circuit 100 into a self test mode in response to a trigger signal generated by the power-on detection circuit 103.

A memory 104, an analog circuit 105 and a logic circuit 106 each constituted as a functional module are mounted at the semiconductor integrated circuit 100. The memory 104 in this structure may be, for instance, a RAM (random access memory) which is a volatile storage medium. The RAM may be any of various types of RAM including DRAM (dynamic RAM) having a dynamic storage function. In addition, the analog circuit 105 may be, for instance, a digital/analog (D/A) converter or an analog/digital (A/D) converter.

The memory 104, the analog circuit 105 and the logic circuit 106 are each provided with a built-in self testing circuit (BIST circuit). The memory 104 is provided with a memory built-in self testing circuit 104a. The analog circuit 105 is provided with an analog built-in self testing circuit 105a. A logic built-in self testing circuit is built into part of the logic circuit 106. The memory 104, the analog circuit 105 and the logic circuit 106 are connected to one another through an internal bus (not shown).

The self test control circuit 102 controls the memory built-in self testing circuit 104a, the analog built-in self testing circuit 105a and the logic built-in self testing circuit. After it is verified that the self tests conducted by all the built-in self testing circuits indicate "normal" results in a built in self test mode, the semiconductor integrated circuit 100 shifts to a regular operating mode.

In the built-in self test mode, the functional modules 104, 105 and 106 are all disconnected from input/output terminals 110 to ensure that they are not affected by external factors originating from the outside of the semiconductor integrated circuit 100. When the built-in self test mode is exited with "normal" results and the operation shifts to the regular operating mode, the input/output terminals 110 become connected to the logic circuit 106. The functional modules 104, 105 and 106 can be disconnected from and connected to the input/output terminals 110 with ease by opening/closing a switch 110a, as shown in FIG. 1. Namely, the switch 110a is opened in the built-in self test mode to disconnect the functional modules 104, 105 and 106 from the input/output terminals 110. In the regular operating mode, on the other hand, the switch 110a is closed to connect the functional modules 104, 105 and 106 to the input/output terminals 110.

Next, the individual self testing operations performed on the memory 104, the analog circuit 105 and the logic circuit 106 in the semiconductor integrated circuit 100 are explained.

As the operation enters the built-in self test mode, the memory built-in self testing circuit 104a automatically generates control signals for the memory 104 such as an address control signal, a data control signal, a read/write enable control signal and a chip-enable control signal. A March test is performed on all the cells constituting the memory 104, and if a mismatch in the read data is detected, the memory 104 returns a "fail" output indicating that an error has occurred.

Now, the operation of the analog built-in self testing circuit 105a is explained by assuming that the analog circuit 105 is constituted of a D/A converter and an A/D converter. As the operation enters the built-in self test mode, the analog built-in self testing circuit 105a connects the output value from the D/A converter as the input value of the A/D converter. Then, the analog built-in self testing circuit 105a automatically generates the input value of the D/A converter, i.e., the output value of the A/D converter. If a mismatch is detected in the conversion results obtained at the D/A converter or the A/D converter, the analog circuit 105 returns a "fail" output.

The logic built-in self testing circuit may be embodied any of various manners depending upon the specific function of the logic circuit 106. For instance, if the self test is conducted to improve the failure detection rate, it is desirable to generate a scan (ATPG) pattern in the LSI as in mass production tests to conduct the self test. A specific method that may be adopted to achieve this is to be explained later in reference to a subsequent embodiment.

After it is verified that all the functional modules 104, 105 and 106 are operating normally, the switch 110a is connected to connect the input/output terminals 110 to the logic circuit 106. The semiconductor integrated circuit 100 thus enters the regular operating mode.

Advantages of the First Embodiment

As explained above, the semiconductor integrated circuit 100 in the embodiment is capable of detecting that the power to the semiconductor integrated circuit 100 has been turned on for itself to allow itself to automatically shift to the built-in self test mode. In addition, by building the power-on detection circuit 102 into the semiconductor integrated circuit 100 instead of providing it as an external component, the scale of the system that includes the semiconductor integrated circuit 100 can be reduced.

Self tests can be automatically performed within the semiconductor integrated circuit 100 by providing the built-in self testing circuits at the individual functional modules 104, 105 and 106 without having to provide external components. As a result, the scale of the system which includes the built-in semiconductor integrated circuit 100 can be reduced. Furthermore, by building up the built-in self testing circuits provided in the functional modules 104, 105 and 106 respectively to a sufficient degree, a high quality self test comparable to the test conducted prior to shipment can be performed even after the semiconductor integrated circuit 100 is built into the system.

SECOND EMBODIMENT

Figure 2:
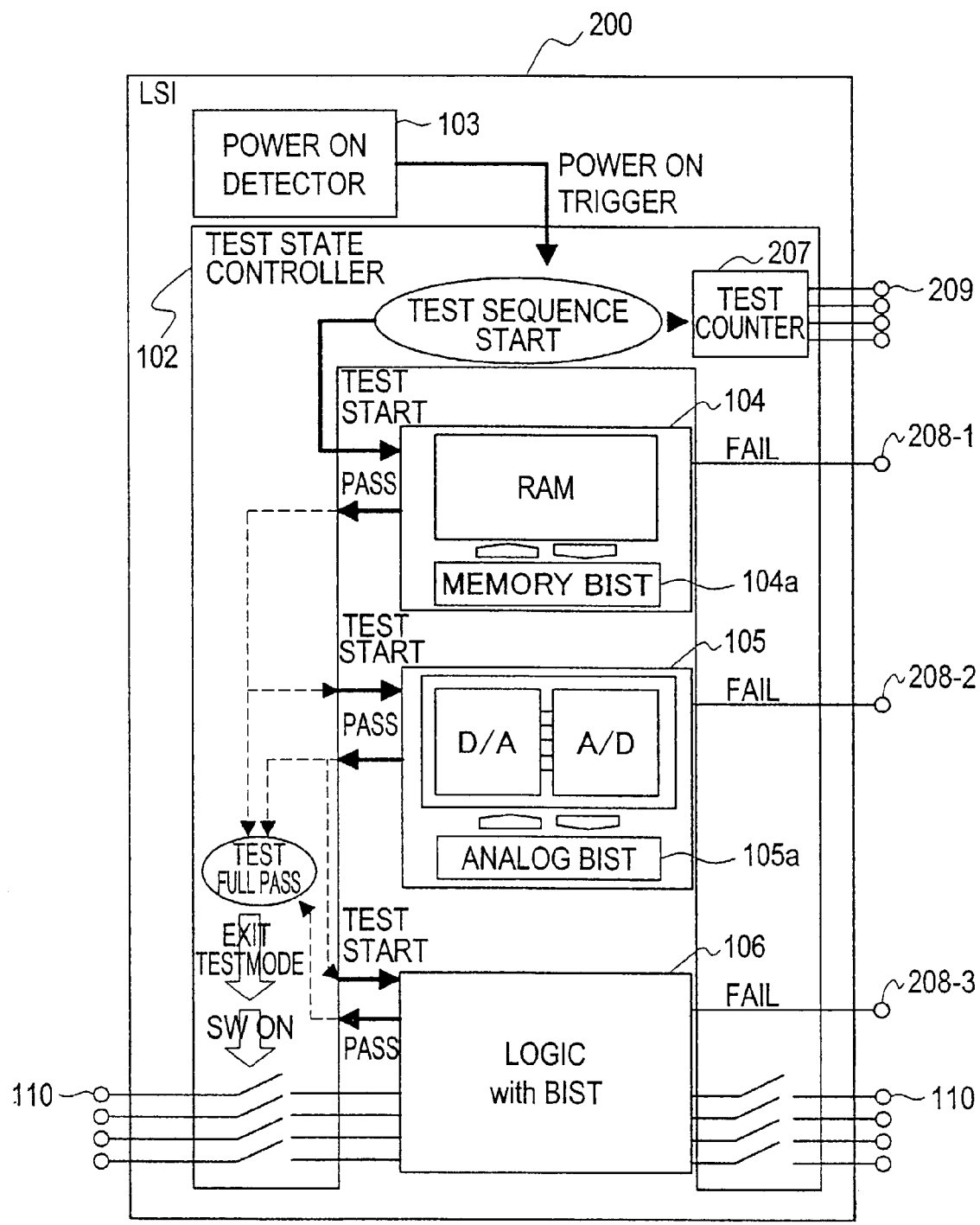
FIG. 2 illustrates the circuit structure adopted in a second embodiment.

The semiconductor integrated circuit in the second embodiment is now explained in reference to FIG. 2.

As shown in FIG. 2, a semiconductor integrated circuit 200 is achieved by adding self test result output terminals 208-1, 208-2 and 208-3 through which the results of the self tests are output to the outside, a test counter 208 capable of measuring the length of time (test cycle) elapsing through each self test to allow information as to at what point in time an error has occurred to be output and a counter output terminal 209 through which the value obtained at the test counter 207 is output to the structure of the semiconductor integrated circuit 100 achieved in the first embodiment. Since other components are substantially identical to those in the first embodiment, the same reference numerals are assigned to them to preclude the necessity for a repeated explanation thereof.

Next, the individual self testing operations performed on the memory 104, the analog circuit 105 and the logic circuit 106 in the semiconductor integrated circuit 200 are explained.

In this embodiment, the self test control circuit 102 outputs the results ("normal" or "error") of the self tests conducted by the individual built-in self testing circuits to the self test result output terminals 208-1, 208-2 and 208-3 respectively during the process of controlling the individual self tests on the memory 104, the analog circuit 105 and the logic circuit 106. Thus, if an error occurs, the specific functional module where the error has occurred can be identified.

In addition, the test counter 207 is provided to measure the length of time (test cycle) elapsing through each self test and to output the information as to the point in time at which an error has occurred. The counter value obtained at the test counter 207 can be output through the output terminal 209. As a result, the functional module where an error has occurred can be identified with an even higher degree of accuracy.

Advantages of the Second Embodiment

As explained above, the functional modules 104, 105 and 106 each includes a self test result output terminal 208 through which the results of the self test are output in the embodiment to reduce the length of time required to analyze a problem and to achieve quick feedback. In addition, since the counter 207 capable of measuring the length of time elapsing through each self test is provided to output information as to at what point in time an error has occurred together with the self test results, the information as to the time point at which the problem has been discovered can be output as a time point to which the self test cycle has advanced during the self test to enable an even more accurate identification of the problem.

THIRD EMBODIMENT

An example of the logic circuit 106 and an example of the logic built-in self testing circuit provided in part of the logic circuit are now explained in reference to the third embodiment.

Figure 3:
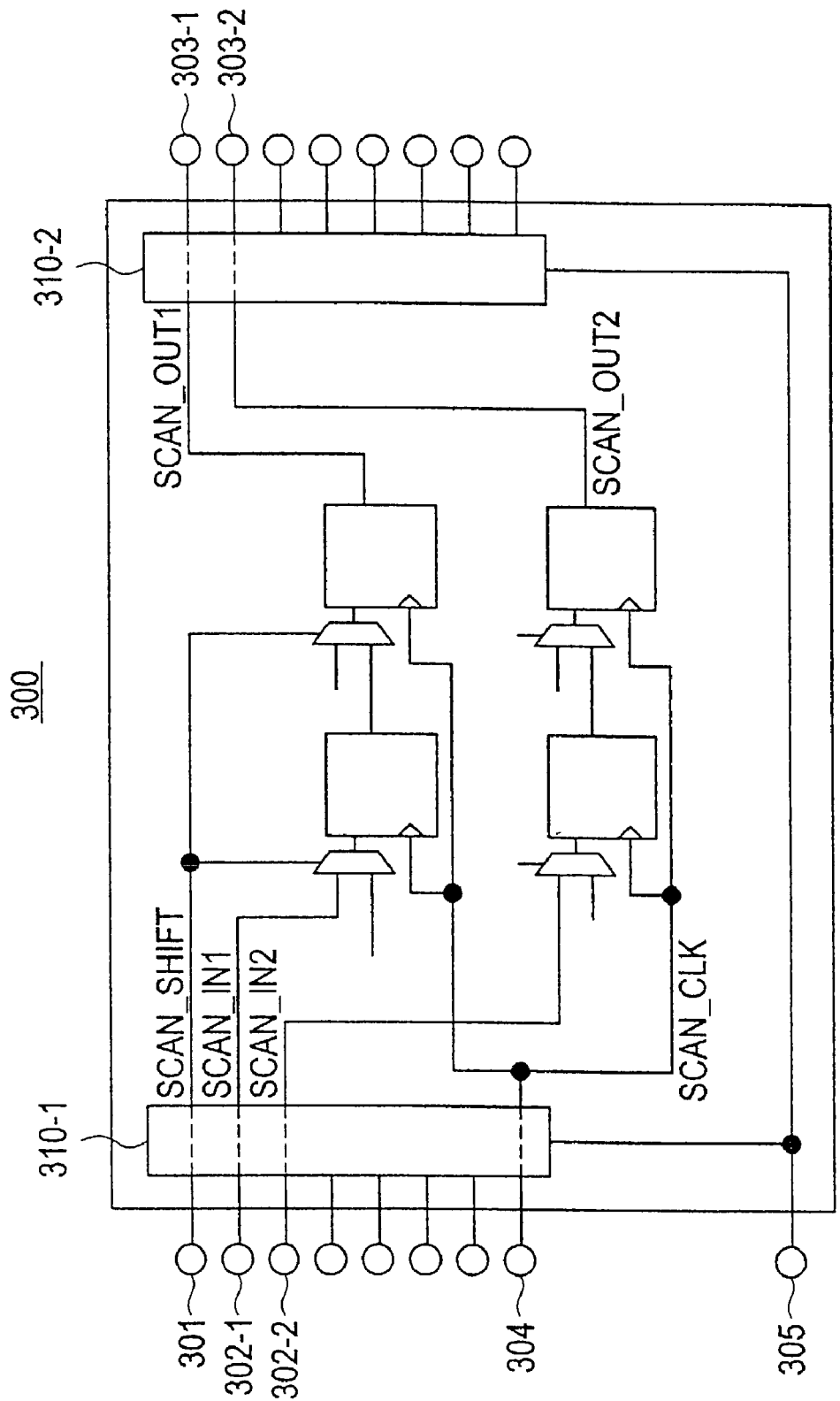
FIG. 3 illustrates the structure that may be adopted in a logic circuit.

FIG. 3 shows an example of a logic circuit having a SCAN test circuit.

This logic circuit 300 includes a testing system for conducting a test referred to as a SCAN test. The logic circuit 300 may be tested at the time of shipment of the product in which the logic circuit 300 is mounted, for instance. In the test mode, the chip terminals of the logic circuit 300 are designated as a SCAN shift enable terminal 301, SCAN-in terminals 302-1 and 302-2, SCAN-out terminals 303-1 and 303-2, a clock terminal 304 and a SCAN test mode terminal 305. The designations of the individual terminals are determined by terminal designation selectors 310-1 and 310-2.

Next, the testing operation performed in the logic circuit 300 is explained.

The test is started as a test mode signal is input through the SCAN test mode terminal 305. As the test starts, a shift enable signal SCAN_SHIFT and input patterns SCAN_IN1 and SCAN_IN2 are input from the outside of the logic circuit 300 in synchronization with a clock signal SCAN_CLK input through the clock terminal 304. The logic circuit 300 engages in operation in response to the clock signal SCAN_CLK, the shift enable signal SCAN_SHIFT and the input patterns SCAN_IN1 and SCAN_IN2.

Then, output patterns obtained via the logic circuit 300 are output through the SCAN-out terminals 303-1 and 303-2. The output patterns output from the SCAN-out terminals 303-1 and 303-2 are compared against expected values at a logic tester (not shown) provided outside the logic circuit 300. Any problems in the logic circuit 300 are detected in this manner. Problems that may occur in the logic circuit 300 include, for instance, a "degeneration failure" whereby the output value of the logic circuit 300 becomes fixed at 0 or 1 due to circuit shorting or the like.

Figure 4:
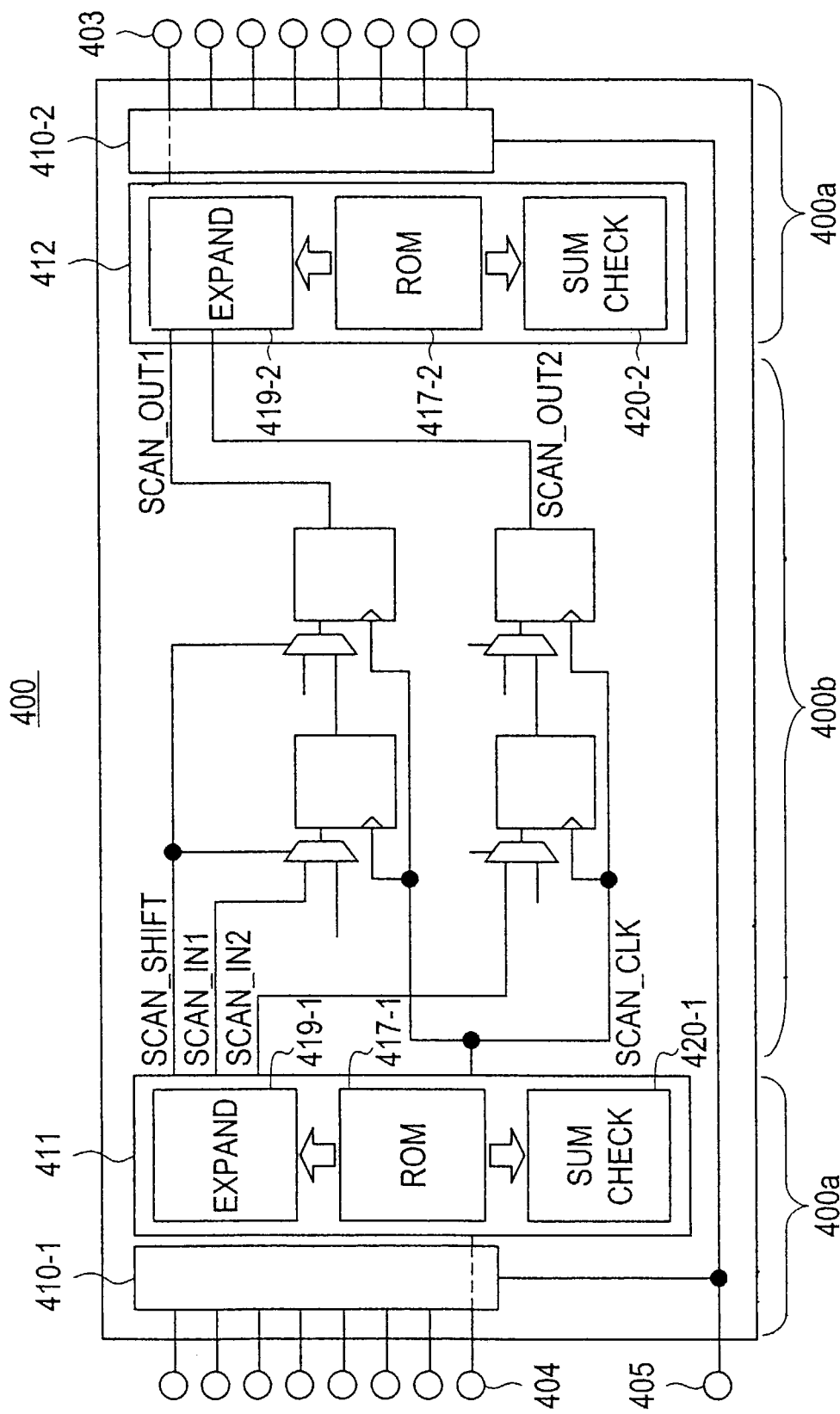
FIG. 4 illustrates another structure that may be adopted in the logic circuit.

FIG. 4 illustrates another structure that may be adopted in the logic circuit.

This logic circuit 400 includes a testing system capable of conducting a test similar to the SCAN test described above. The logic circuit 400 is tested when the power to the product that includes the built-in logic circuit 400 as a component is turned on even after the product is shipped and delivered to the user as well as at the time of the shipment of the product.

The logic circuit 400 is constituted of a logic built-in self testing circuit 400a that conducts a self test and a logic unit 400b having various logic elements. The logic built-in self testing circuit 400a includes a scan pattern generator 411 and a scan pattern comparator 412. The following explanation focuses on the logic built-in self testing circuit 400a.

In the self test mode, the chip terminals of the logic circuit 400 are designated as a SCAN-out terminal 403, a clock terminal 404 and a SCAN test mode terminal 405. The designations of the individual terminals are determined by terminal designation selectors 410-1 and 410-2. It is to be noted that this logic circuit 400 does not include a SCAN-shift enable terminal or SCAN-in terminals. In addition, the SCAN-out terminal 403 is a terminal through which the results of a self test are output.

As shown in FIG. 4, the scan pattern generator 411 includes a ROM 417-1, a data decompression circuit 419-1 and a checksum decision-making circuit 420-1. Likewise, the scan pattern comparator 412 includes a ROM 417-2, a data decompression circuit 419-2 and a checksum decision-making circuit 420-2. These components are explained individually below.

Self test patterns are stored in the ROMs (read only memories) 417-1 and 417-2 each constituted of a nonvolatile memory provided within the logic circuit. Input self test patterns (hereafter referred to as the input patterns) are stored in the ROM 417-1, whereas output self test patterns (hereafter referred to as the output patterns) are stored in the ROM 417-2.

Input patterns having undergone compression processing are stored in the ROM 417-1. The compressed input patterns are decompressed at the data decompression circuit 419-1. Likewise, output patterns having undergone compression processing are stored in the ROM 417-2. The compressed output patterns are decompressed at the data decompression circuit 419-2.

The checksum decision-making circuit 420-1 detects any defect in the compressed input patterns stored in the ROM 417-1. Likewise, the checksum decision-making circuit 420-2 detects any defect in the compressed output patterns stored in the ROM 417-2.

Next, the self testing operation performed in the logic circuit 400 is explained.

The self-test is started as a test mode signal is input through the SCAN test mode terminal 405. After the self test starts, the checksum decision making circuit 420-1 detects any defect in the input patterns. Likewise, the checksum decision making circuit 420-2 detects any defect in the output patterns. If it is decided that no defect is present in either the input patterns or the output patterns, the operation shifts into the self test mode.

Once the operation shifts to the self test mode, the input patterns stored in the ROM 417-1 are read out and the patterns are expanded by the data decompression circuit 419-1. Likewise, the output patterns stored in the ROM 417-2 are read out and the patterns are expanded by the data decompression circuit 419-2.

In synchronization with the clock signal SCAN_CLK input through the 404, the shift enable signal SCAN_SHIFT and the input patterns SCAN_IN1 and SCAN_IN2 are output from the scan pattern generator 411. The logic unit 400*b* engages in operation in response to the clock signal SCAN_CLK, the shift enable signal SCAN_SHIFT and the input patterns SCAN_IN1 and SCAN_IN2.

Then, expected values of the output patterns SCAN_OUT1 and SCAN_OUT2 output via the logic unit 400*b* and the patterns expanded by the data decompression circuit 419-2 are compared against each other. The results of the comparison are output through SCAN-out terminal 403. Based upon these comparison results, problems such as a degeneration failure at the 400 are detected.

Advantages of the Third Embodiment

As explained above, in the embodiment having self test patterns stored in the ROMs 417-1 and 417-2 provided within the logic circuit 400, automatic test pattern generation (ATPG) can be realized in hardware to conduct a self test achieving a high failure detection rate.

In addition, by providing the decompression circuits 419-1 and 419-2 for decompressing the self test patterns, automatic test pattern generation can be realized with fewer self test patterns to allow the physical size of the ROMS 417-1 and 417-2 to be reduced. Furthermore, by providing the checksum decision making circuits 420-1 and 420-2 in conjunction with the ROMs 417-1 and 417-2 respectively, any defects in the self test patterns can be eliminated to achieve an even more reliable self test.

While the invention has been particularly shown and described with respect to preferred embodiments of the semiconductor integrated circuit by referring to the attached drawings, the present invention is not limited to these examples and it will be understood by those skilled in the art that various changes in form and detail may be made therein without departing from the spirit, scope and teaching of the invention.

As explained above, according to the present invention having the individual built-in self testing circuits in conjunction with the functional modules, self tests can be automatically conducted within the semiconductor integrated circuit without having to provide any external components. As a result, the scale of the system that includes the built-in semiconductor integrated circuit can be reduced, and furthermore, by building up the built-in self testing circuits in the individual functional modules to a sufficient degree, a high-quality self test comparable to the test conducted at the time of shipment can be performed even after the semiconductor integrated circuit is built into the system.

What is claimed is:

1. A semiconductor integrated circuit, comprising:
   one or a plurality of functional modules each having a built-in self testing circuit; and
   a self test control circuit that individually controls the self testing circuits,
   wherein one of said functional modules is a logic circuit constituted of various logic elements, and said logic circuit includes a logic built-in self testing circuit that conducts a self test when power is turned on,
   wherein said logic circuit is internally provided with a nonvolatile memory, and a self test pattern is stored in said nonvolatile memory, and
   wherein said logic circuit is internally provided with a pattern defect detection circuit that detects any defect in the self test pattern.

2. A semiconductor integrated circuit according to claim 1, further comprising:
   a power-on detection circuit that detects that the power has been turned on.

3. A semiconductor integrated circuit according to claim 1, wherein one of said functional modules is a memory in which data are stored, and said memory includes a memory built in self testing circuit that conducts a self test when the power is turned on.

4. A semiconductor integrated circuit according to claim 3, wherein said memory is RAM.

5. A semiconductor integrated circuit according to claim 1, wherein one of said functional modules is an analog circuit that processes analog data, and said analog circuit includes an analog built-in self testing circuit that conducts a self test when the power is turned on.

6. A semiconductor integrated circuit according to claim 5, wherein said analog circuit is constituted of an analog/digital conversion circuit and a digital/analog conversion circuit.

7. A semiconductor integrated circuit according to claim 1, further comprising:
   a switch that disconnects said functional modules from an input/output terminal during self tests of said functional modules.

8. A semiconductor integrated circuit according to claim 1, wherein said functional modules each include a self test result output terminal through which results of self tests are output.

9. A semiconductor integrated circuit according to claim 8, further comprising:
   a counter that measures a length of time elapsing through a self test, wherein the length of time measured by said counter is output together with the results of the self test.

10. A semiconductor integrated circuit according to claim 1, wherein a self test pattern having undergone compression processing is stored in said nonvolatile memory, and said logic circuit is internally provided with a data decompression circuit that decompresses the compressed self test pattern.

11. A semiconductor integrated circuit according to claim 5, wherein said analog circuit is constituted by one of an analog/digital conversion circuit and a digital/analog conversion circuit.

* * * * *